United States Patent
Sun et al.

(10) Patent No.: US 7,815,266 B2
(45) Date of Patent: Oct. 19, 2010

(54) CABINET FOR ELECTRONIC DEVICES

(75) Inventors: Ke Sun, Shenzhen (CN); Zhen-Xing Ye, Shenzhen (CN); Ming-Ke Chen, Shenzhen (CN); Xiao-Zhu Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 425 days.

(21) Appl. No.: 11/965,760

(22) Filed: Dec. 28, 2007

(65) Prior Publication Data

US 2009/0153005 A1 Jun. 18, 2009

(30) Foreign Application Priority Data

Dec. 14, 2007 (CN) .......................... 2007 1 0203061

(51) Int. Cl.
*A47B 83/00* (2006.01)
(52) U.S. Cl. ................................. 312/235.1; 312/223.1
(58) Field of Classification Search .............. 312/223.1, 312/235.1; 182/35, 88; 296/62; 280/163
See application file for complete search history.

(56) References Cited

U.S. PATENT DOCUMENTS

| | | | |
|---|---|---|---|
| 560,752 A * | 5/1896 | Prator | 182/156 |
| 3,434,566 A * | 3/1969 | Miller | 182/15 |
| 3,796,456 A * | 3/1974 | Bergeson et al. | 296/156 |
| 3,834,490 A * | 9/1974 | Ford | 182/88 |
| 4,846,304 A * | 7/1989 | Rasmussen | 182/88 |
| 5,547,040 A * | 8/1996 | Hanser et al. | 182/88 |
| 6,655,706 B1 * | 12/2003 | Murrell | 280/166 |
| 6,659,224 B2 * | 12/2003 | Medsker | 182/91 |
| 6,791,841 B1 * | 9/2004 | Tirrell et al. | 361/724 |
| 7,677,584 B2 * | 3/2010 | Raley et al. | 280/166 |
| 2001/0037985 A1 * | 11/2001 | Varghese et al. | 211/26 |
| 2003/0042700 A1 * | 3/2003 | Ueno | 280/166 |
| 2004/0251080 A1 * | 12/2004 | Kalos | 182/35 |
| 2008/0157500 A1 * | 7/2008 | Raley et al. | 280/166 |

FOREIGN PATENT DOCUMENTS

| | | | |
|---|---|---|---|
| EP | 709049 | * | 5/1996 |
| JP | 03007107 | * | 1/1991 |
| JP | 10174634 | * | 6/1998 |
| JP | 2005124969 | * | 5/2005 |

* cited by examiner

*Primary Examiner*—Janet M Wilkens
(74) *Attorney, Agent, or Firm*—Frank R. Niranjan

(57) ABSTRACT

A cabinet is provided for electronic devices. The cabinet includes a rack receiving a plurality of electronic device, and a climbing platform. The climbing platform includes a receiving member installed in the rack, and a folding stepladder slidably received in the receiving member. The folding stepladder is pulled out from the receiving member and unfolded to become a ladder.

9 Claims, 3 Drawing Sheets

CABINET FOR ELECTRONIC DEVICES

BACKGROUND

1. Field of the Invention

The present invention relates to cabinets, and more particularly to a cabinet for electronic devices.

2. Description of Related Art

Electronic devices, such as servers, are generally rack-mounted in a cabinet. However, because the cabinet is typically taller than a user, when the user wants to put a server at an upper portion of the cabinet or to operate servers at the upper portion of the cabinet, a ladder or another climbing tool is required.

What is needed, therefore, is a cabinet which facilitates manipulating servers installed in the cabinet.

SUMMARY

An exemplary cabinet is provided for electronic devices. The cabinet includes a rack receiving a plurality of electronic device, and a climbing platform. The climbing platform includes a receiving member installed in the rack, and a folding stepladder slidably received in the receiving member. The folding stepladder is pulled out from the receiving member and unfolded to become a ladder.

Other advantages and novel features will become more apparent from the following detailed description of embodiment when taken in conjunction with the accompanying drawings, in which:

DETAILED DESCRIPTION

Figure 1:
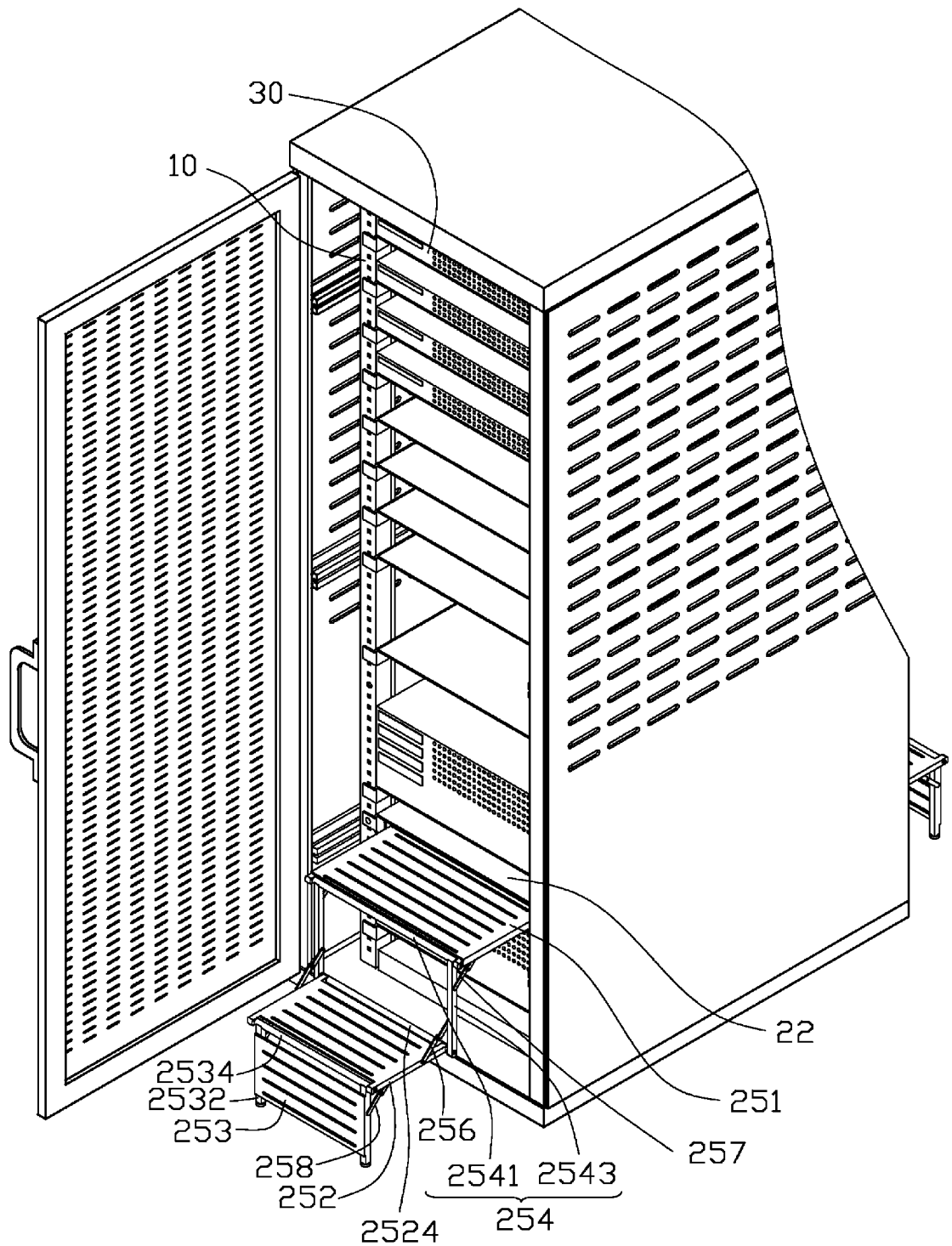
FIG. 1 is an assembled view of a cabinet with a climbing platform in use in accordance with an embodiment of the present invention.
Figure 3:
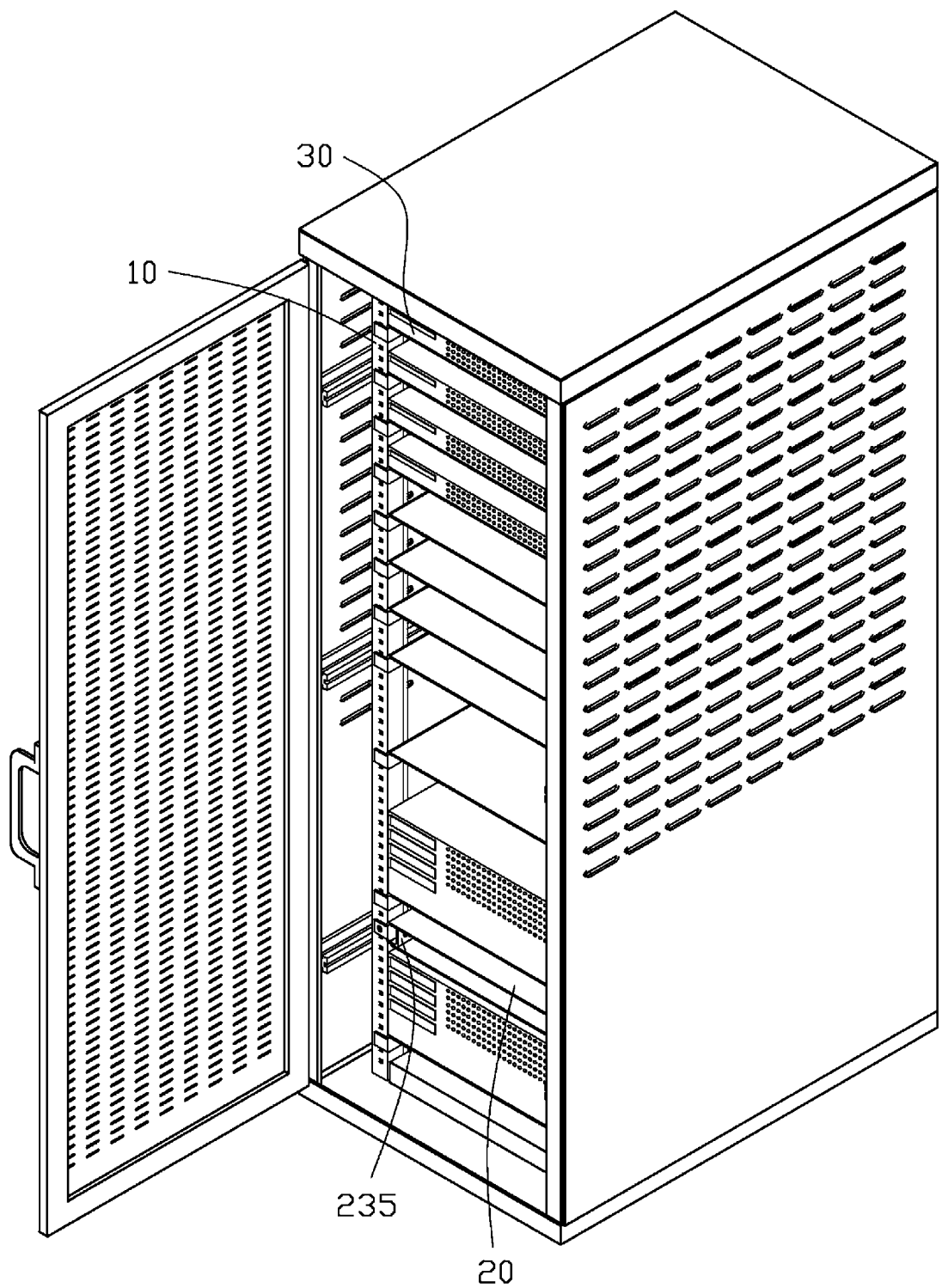
FIG. 3 is similar to FIG. 1, but the climbing platform is not in use.

Referring to FIGS. 1 and 3, a cabinet for a plurality of electronic devices 30 is provided in accordance with an embodiment of the present invention. The cabinet includes a rack 10 installed therein for supporting the electronic devices 30, and a climbing platform 20 received in the rack 10.

Figure 2:
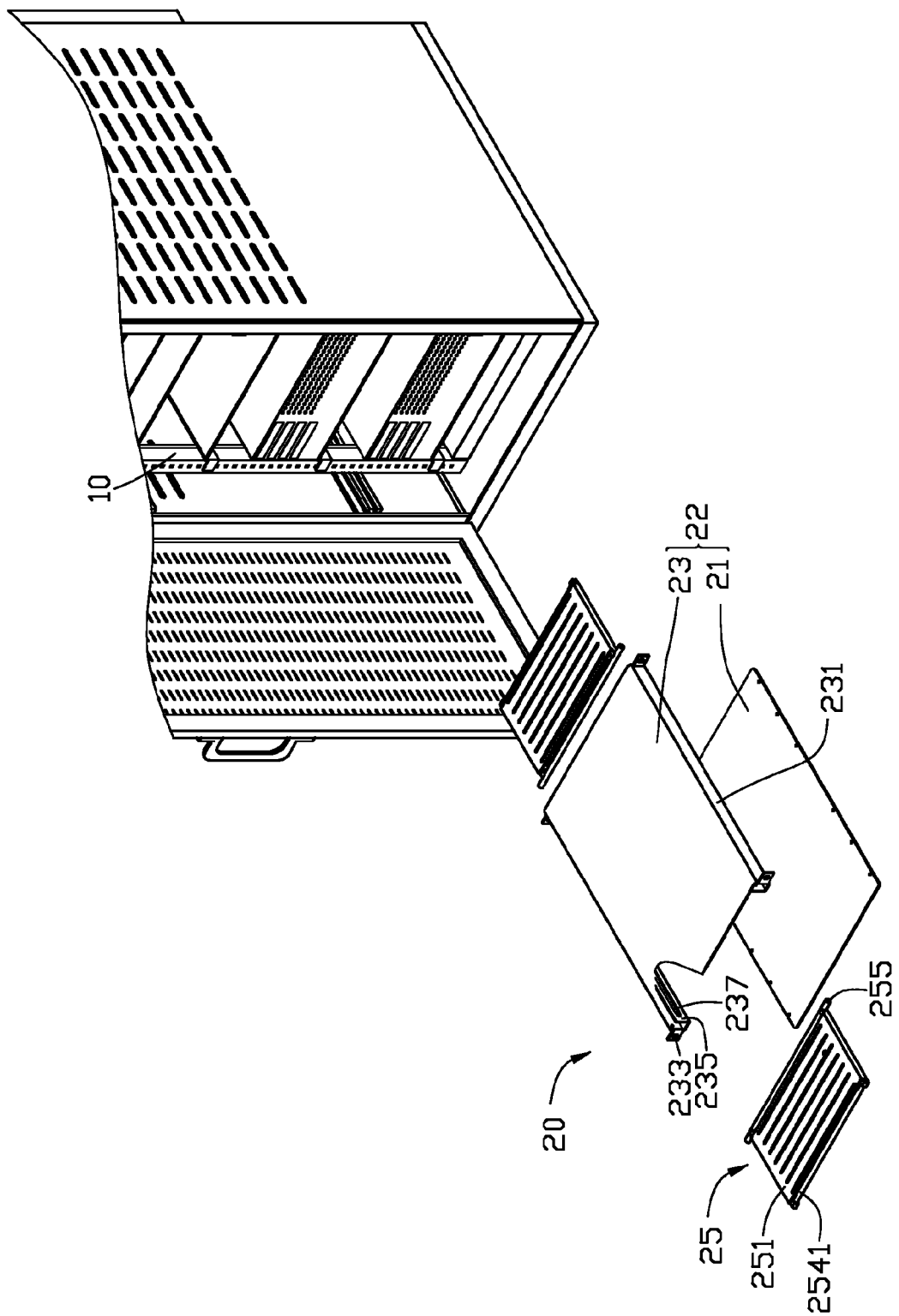
FIG. 2 is a partially exploded, isometric view of FIG. 1.

Referring to FIGS. 1 and 2, the climbing platform 20 includes a receiving member 22, and two folding stepladders 25 coupled to the receiving member 22.

The receiving member 22 includes a bottom plate 21, and a cover 23. The cover 23 includes two opposite sidewalls 231, and two tabs 233 respectively and perpendicularly extend out from opposite ends of each sidewall 231. A sliding rail 235 having an L-shaped cross section is formed on an inside surface of each sidewall 231, and two sliding slots 237 parallel with the cover 23 are respectively defined in front and rear sections of a vertical plate of the sliding rail 235.

Each folding stepladder 25 includes a plate-shaped first step piece 251, a plate-shaped second step piece 252, a first supporting portion 254 pivotably connected between the first and second step pieces 251, 252, and a second supporting portion 253 pivotably connected to the second step piece 252. The first step piece 251 forms a post 255 at a rear end thereof, and both ends of the post 255 extend out of two sidewalls of the first step piece 251 respectively. The first supporting portion 254 includes two parallel supporting poles 2543, and a shaft 2541 connecting with distal ends of the supporting poles 2543. Two ends of the shaft 2541 extend out of the supporting poles 2543 respectively and are pivotably connected to the front sections of the sides of the first step piece 251. A receiving space is defined among the supporting poles 2543 and the shaft 2541. The second step piece 252 and the second supporting portion 253 respectively form shafts 2524, 2534 at rear ends thereof, and ends of the shafts 2524, 2534 extend out of sidewalls of the second step piece 252 and the second supporting portion 253 respectively. Two spaced feet 2532 extend from a free end of the second supporting portion 253. The second step piece 252 is pivotably connected to free ends of the supporting poles 2543 of the first supporting portion 254 via the shaft 2524, and the second supporting portion 253 is connected to a front end of the second step piece 252 via the shaft 2534. Two first folding poles 257 are provided, with first ends thereof being connected to inside surfaces of the sidewalls of the first step piece 251 respectively, and second ends thereof being connected to outside surfaces of the supporting poles 2543 of the first supporting portion 254 respectively. Two second folding poles 256 are provided, with first ends thereof being connected to inside surfaces of the supporting poles 2543 of the first supporting portion 254 respectively, and second ends thereof being connected to outside surfaces of the sidewalls of the second step piece 252 respectively. Two third folding poles 258 are provided, with first ends thereof being connected to inside surfaces of the sidewalls of the second step piece 252 respectively, and second ends thereof being connected to outside surfaces of the sidewalls of the second supporting portion 253 respectively. Each of the first, second, and third folding poles 257, 256, 258 includes two pivotably connected poles. When the first folding poles 257 are unfolded, and the angle between the poles of each first folding pole 257 is 180 degrees, the first supporting portion 254 is perpendicular to the first step piece 251. When the second folding poles 256 are unfolded, and the angle between the poles of each second folding pole 256 is 180 degrees, the first supporting portion 254 is perpendicular to the second step piece 252. When the third folding poles 258 are unfolded, and the angle between the poles of each third folding pole 258 is 180 degrees, the second supporting portion 253 is perpendicular to the second step piece 252.

In assembly, the second supporting portion 253 of each folding stepladder 25 is rotated to be folded to the corresponding second step piece 252. The second step piece 252 and the second supporting portion 253 are rotated to be folded to the corresponding first supporting portion 254 and received in the receiving space of the first supporting portion 254. Then the first supporting portion 254, the second step piece 252, and the second supporting portion 253 are rotated to be folded to the corresponding first step piece 251. Thereby, the folding stepladders 25 are folded, as shown in FIG. 2. Thereafter, the folded folding stepladders 25 are received in front and rear portions of the receiving member 22 respectively, with the free ends of the posts 255 of the folding stepladders 25 being slidably received in the sliding slots 237 of the sliding rails 235 of the cover 23 respectively, and the bottom plate 21 being fixed to the cover 23. Thereby, the climbing platform 20 is assembled. Four fasteners, such as screws are extended through the tabs 233 of the receiving member 22 and then engage in lower portions of four vertical shafts of the rack 10. Thereby, the climbing platform 20 is installed in the rack 10, as shown in FIG. 3.

Referring further to FIG. 1, when there is a need to use one of the folding stepladders 25 of the climbing platform 20, the folding stepladder 25 is pulled out from the receiving member 22 until the free ends of the post 255 of the folding stepladder 25 abut against front ends of the sliding slots 237 of the receiving member 22 respectively. The first supporting portion 254 is rotated downward until the angle between the poles of each first folding pole 257 is 180 degrees, and the first supporting portion 254 is perpendicular to the first step piece 251. The second step piece 252 is rotated away from the first supporting portion 254 until the angle between the poles of each second folding pole 256 is 180 degrees, and the second step piece 252 is perpendicular to the first supporting portion 254. The second supporting portion 253 is rotated downward until the angle between the poles of each third folding pole 258 is 180 degrees, and the second supporting portion 253 is perpendicular to the second step piece 252, and the feet of the second supporting portion 253 are supported on the same surface supporting the cabinet. Thereby, the folding stepladder 25 is exposed out of the rack 10 and unfolded to form a ladder, the first and second step pieces 251, 252 are parallel with the ground. The second step piece 252 is supported by the second supporting portion 253 and the third folding poles 258, the first supporting portion 254 is supported by the second step piece 252 and the second folding poles 256, and the first step piece 251 is supported by the first supporting portion 254 and the first folding poles 257. An user can stand on the first step piece 251 or the second step piece 252 to operate electronic devices 30 at the upper portion of the cabinet.

When there is no need to use the folding stepladder 25, the folding stepladder 25 can be folded to be received in the receiving member 22 installed in the rack 10.

It is believed that the present embodiment and its advantages will be understood from the foregoing description, and it will be apparent that various changes may be made thereto without departing from the spirit and scope of the invention or sacrificing all of its material advantages, the example hereinbefore described merely being preferred or exemplary embodiment of the invention.

What is claimed is:

1. A cabinet for electronic devices, the cabinet comprising:
   a rack receiving a plurality of electronic devices; and
   a climbing platform comprising a receiving member installed in the rack, and a folding stepladder slidably received in the receiving member and capable of being unfolded to form a ladder when the folding stepladder is pulled out from the receiving member,
   wherein two sliding rails are formed on opposite sides of the receiving member respectively, the folding stepladder comprises a first step piece forming a post on a rear end thereof, two free ends of the post are slidably connected to the sliding rails of the receiving member respectively.

2. The cabinet as claimed in claim 1, wherein each of the sliding rails defines a sliding slot, and the free ends of the post are slidably received in the sliding slots respectively.

3. The cabinet as claimed in claim 1, wherein the folding stepladder comprises a first step piece slidably connected to the receiving member, a second step piece, a first supporting portion pivotably connected between the first and second step pieces, and a second supporting portion pivotably connected to the second step piece, two first folding poles are connected between the first step piece and the first supporting portion, two second folding poles are connected between the first supporting portion and the second step piece, and two third folding poles are connected between the second step piece and the second supporting portion.

4. The cabinet as claimed in claim 3, wherein each of the first, second, and third folding poles includes two pivotably connected poles, when the first, second, and third folding poles are unfolded, the angle of the poles of each of the first, second, and third folding poles is 180 degrees, and the first and second step pieces are at different levels.

5. The cabinet as claimed in claim 3, wherein the first supporting portion comprises a shaft pivotably connected to the first step piece, and two parallel supporting poles perpendicularly extending from the shaft, a receiving space is defined among the supporting poles and the shaft.

6. The cabinet as claimed in claim 5, wherein each of the first step piece, the second step piece, and the second supporting portion comprises two opposite sidewalls, two ends of the first folding poles are connected to inside surfaces of the sidewalls of the first step piece and outside surfaces of the supporting poles of the first supporting portion respectively, two ends of the second folding poles are connected to inside surfaces of the supporting poles of the first supporting portion and outside surfaces of the sidewalls of the second step piece respectively, two ends of the third folding poles are connected to inside surfaces of the sidewalls of the second step piece and outside surfaces of the sidewalls of the second supporting portion.

7. The cabinet as claimed in claim 3, wherein two spaced feet extend from a free end of the second supporting portion.

8. The cabinet as claimed in claim 1, wherein the rack comprises four vertical shafts, the receiving member comprises two opposite sidewalls, two tabs perpendicularly extend out from opposite ends of each of the sidewalls, four fasteners are extended through the tabs of the receiving member and then engage in lower portions of the vertical shafts of the rack.

9. A cabinet for electronic devices, the cabinet comprising:
   a rack receiving a plurality of electronic devices; and
   a climbing platform comprising a receiving member installed in the rack, and a folding stepladder slidably received in the receiving member and capable of being unfolded to form a ladder when the folding stepladder is pulled out from the receiving member,
   wherein the folding stepladder comprises a first step piece slidably connected to the receiving member, a second step piece, a first supporting portion pivotably connected between the first and second step pieces, and a second supporting portion pivotably connected to the second step piece, two first folding poles are connected between the first step piece and the first supporting portion, two second folding poles are connected between the first supporting portion and the second step piece, and two third folding poles are connected between the second step piece and the second supporting portion.

* * * * *